(12) United States Patent
Kim et al.

(10) Patent No.: US 12,197,327 B2
(45) Date of Patent: *Jan. 14, 2025

(54) DECODING DEVICE FOR DETERMINING WHETHER TO DECODE DATA UNIT, AND OPERATING METHOD THEREOF

(71) Applicant: SK hynix Inc., Icheon-si (KR)

(72) Inventors: Dae Sung Kim, Icheon-si (KR); Bi Woong Chung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/338,797

(22) Filed: Jun. 21, 2023

(65) Prior Publication Data

US 2024/0118999 A1    Apr. 11, 2024

Related U.S. Application Data

(63) Continuation of application No. 18/153,348, filed on Jan. 11, 2023.

(30) Foreign Application Priority Data

Oct. 6, 2022  (KR) .................. 10-2022-0127689

(51) Int. Cl.
  *G06F 12/06*    (2006.01)
(52) U.S. Cl.
  CPC .................. *G06F 12/06* (2013.01)

(58) Field of Classification Search
  CPC .... G06F 12/06; G06F 11/1641; G06F 11/165; G06F 11/1654; G06F 16/00; G06F 16/90; G06F 2201/83; G06F 40/268; G06F 40/40; G06F 40/58; G06F 9/30021; G06F 9/3806; G06F 9/3844
  USPC .................................................. 711/154, 202
  See application file for complete search history.

(56) References Cited

U.S. PATENT DOCUMENTS

| | | | |
|---|---|---|---|
| 7,206,862 B2 * | 4/2007 | Wheeler | H04L 63/1466 709/217 |
| 10,063,262 B2 | 8/2018 | Morero et al. | |
| 11,108,407 B1 | 8/2021 | Lu et al. | |
| 11,146,289 B2 * | 10/2021 | Bhatia | H03M 13/1108 |
| 2014/0351625 A1 * | 11/2014 | Resch | G06F 11/142 714/6.2 |
| 2016/0134305 A1 | 5/2016 | Morero et al. | |
| 2021/0075691 A1 * | 3/2021 | Zeng | H04L 1/203 |
| 2021/0294662 A1 * | 9/2021 | Goyal | G06F 16/9014 |
| 2021/0399744 A1 * | 12/2021 | Kwok | H03M 13/255 |

* cited by examiner

*Primary Examiner* — Gautam Sain
*Assistant Examiner* — Edward Waddy, Jr.

(57) ABSTRACT

A decoding device may determine a candidate data unit among a plurality of data units included in one data chunk, in parallel with an operation of decoding a target data unit among the plurality of data units. The decoding device may determine whether to decode the candidate data unit, and may decode the candidate data unit according to whether to decode the candidate data unit, after executing decoding on the target data unit.

15 Claims, 11 Drawing Sheets

DECODING DEVICE FOR DETERMINING WHETHER TO DECODE DATA UNIT, AND OPERATING METHOD THEREOF

CROSS-REFERENCE TO RELATED APPLICATION

The present application is a continuation-in-part of pending U.S. patent application Ser. No. 18/153,348, filed on Jan. 11, 2023, which claims priority under 35 U.S.C. § 119(a) to Korean Patent Application No. 10-2022-0127689 filed in the Korean Intellectual Property Office on Oct. 6, 2022, which is incorporated herein by reference in its entirety.

BACKGROUND

1. Technical Field

Various embodiments generally relate to a decoding device for determining whether to decode data unit, and a method for operating a decoding device.

2. Related Art

A storage device is a device that stores data on the basis of a request of an external device such as a computer, a mobile terminal like a smartphone and a tablet, or various other electronic devices.

The storage device may include a controller for controlling a memory (e.g., a volatile memory or a nonvolatile memory). The controller may receive a command from the external device, and may execute or control an operation for reading, writing or erasing data with respect to the memory included in the storage device, consistent with the received command.

A decoding operation on data may be performed while the storage device reads or writes data. The decoding operation may be directly executed by the storage device or may be performed by a separate decoding device.

SUMMARY

Various embodiments are directed to a decoding device and a method for operating a decoding device that is capable of reducing time and power required by avoiding unnecessary decoding of a data unit.

In an embodiment, a decoding device may include: (i) a decoder configured to execute decoding on at least one of a plurality of data units included in one data chunk; and (ii) a pre-processing device configured to determine a candidate data unit from among the plurality of data units, and to determine whether to decode the candidate data unit using the decoder.

In an embodiment, a method for operating a decoding device may include: (i) determining a candidate data unit from among a plurality of data units included in one data chunk, in parallel with an operation of decoding a target data unit from among the plurality of data units; (ii) determining whether to decode the candidate data unit; and (iii) decoding the candidate data unit or skipping decoding on the candidate data unit after executing decoding on the target data unit on determination that the candidate data unit is decoded.

According to the embodiments of the disclosed technology, it is possible to reduce time and power required for decoding by skipping unnecessary decoding of a data unit.

DETAILED DESCRIPTION

Figure 1:
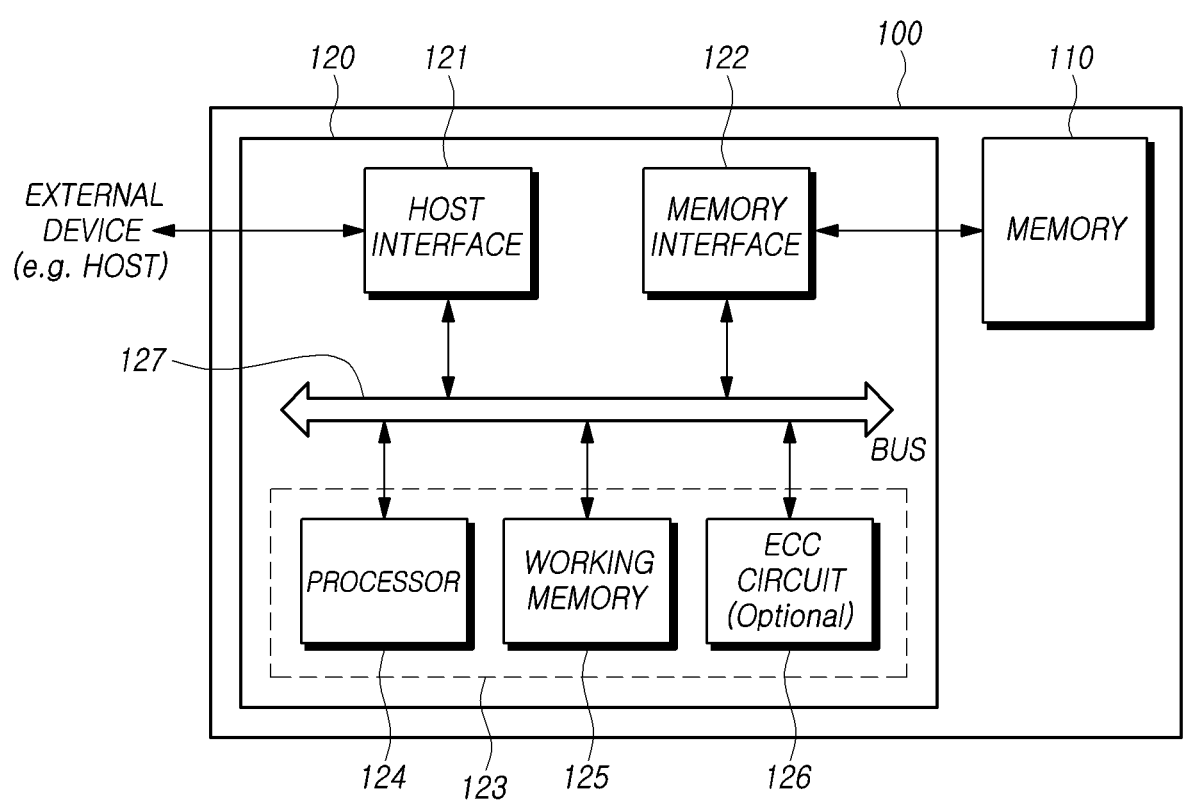
FIG. 1 is a schematic configuration diagram of a storage device according to an embodiment of the disclosure.

Hereinafter, embodiments of the present disclosure are described in detail with reference to the accompanying drawings. Throughout the specification, reference to "an embodiment," "another embodiment" or the like does not necessarily refer to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a schematic configuration diagram of a storage device 100 according to an embodiment of the disclosure.

Referring to FIG. 1, the storage device 100 may include a memory 110 that stores data and a controller 120 that controls the memory 110.

The memory 110 includes a plurality of memory blocks, and operates in response to the control of the controller 120. Operations of the memory 110 may include, for example, a read operation, a program operation (also referred to as a write operation) and an erase operation.

The memory 110 may include a memory cell array including a plurality of memory cells (also simply referred to as "cells") that store data. Such a memory cell array may exist in a memory block.

For example, the memory 110 may be realized in various types of memory such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM) and a spin transfer torque random access memory (SU-RAM).

The memory 110 may be implemented as a three-dimensional array structure. For example, embodiments of the disclosure may be applied to a charge trap flash (CTF) in which a charge storage layer is configured by a dielectric layer and a flash memory in which a charge storage layer is configured by a conductive floating gate.

The memory 110 may receive a command and an address from the controller 120 and may access an area in the memory cell array that is selected by the address. In other words, the memory 110 may perform an operation indicated by the command, on the area selected by the address.

The memory 110 may perform a program operation, a read operation or an erase operation. For example, when performing the program operation, the memory 110 may program data to the area selected by the address. When performing the read operation, the memory 110 may read data from the area selected by the address. In the erase operation, the memory 110 may erase data stored in the area selected by the address.

The controller 120 may control write (program), read, erase and background operations for the memory 110. For example, background operations may include at least one from among a garbage collection (GC) operation, a wear leveling (WL) operation, a read reclaim (RR) operation, a bad block management (BBM) operation, and so forth.

The controller 120 may control the operation of the memory 110 according to a request from a device (e.g., a host) located outside the storage device 100. The controller 120, however, also may control the operation of the memory 110 regardless or in the absence of a request of the host.

The host may be a computer, an ultra mobile PC (UMPC), a workstation, a personal digital assistant (PDA), a tablet, a mobile phone, a smartphone, an e-book, a portable multimedia player (PMP), a portable game player, a navigation device, a black box, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a computer network, one of various electronic devices configuring a telematics network, an RFID (radio frequency identification) device, and a mobility device (e.g., a vehicle, a robot or a drone) capable of driving under human control or autonomous driving, as non-limiting examples.

The host may include at least one operating system (OS). The operating system may generally manage and control the function and operation of the host, and may provide interoperability between the host and the storage device 100. The operating system may be classified into a general operating system and a mobile operating system depending on the mobility of the host.

The controller 120 and the host may be devices that are separated from each other, or the controller 120 and the host may be integrated into one device. Hereunder, for the sake of convenience in explanation, descriptions will describe the controller 120 and the host as devices that are separated from each other.

Referring to FIG. 1, the controller 120 may include a memory interface 122 and a control circuit 123, and may further include a host interface 121.

The host interface 121 provides an interface for communication with the host. For example, the host interface 121 provides an interface that uses at least one from among various interface protocols such as a USB (universal serial bus) protocol, an MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, an SCSI (small computer system interface) protocol, an ESDI (enhanced small disk interface) protocol, an IDE (integrated drive electronics) protocol and a private protocol.

When receiving a command from the host, the control circuit 123 may receive the command through the host interface 121, and may perform an operation of processing the received command.

The memory interface 122 may be coupled with the memory 110 to provide an interface for communication with the memory 110. That is to say, the memory interface 122 may be configured to provide an interface between the memory 110 and the controller 120 in response to the control of the control circuit 123.

The control circuit 123 performs the general control operations of the controller 120 to control the operation of the memory 110. To this end, for instance, the control circuit 123 may include at least one of a processor 124 and a working memory 125, and may optionally include an error detection and correction circuit (ECC circuit) 126.

The processor 124 may control general operations of the controller 120, and may perform a logic calculation. The processor 124 may communicate with the host through the host interface 121, and may communicate with the memory 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the logical block address (LBA) into the physical block address (PBA), by using a mapping table.

There are various address mapping methods of the flash translation layer, depending on a mapping unit. Representative address mapping methods include a page mapping method, a block mapping method and a hybrid mapping method.

The processor 124 may randomize data received from the host. For example, the processor 124 may randomize data received from the host by using a set randomizing seed. The randomized data may be provided to the memory 110, and may be programmed to a memory cell array of the memory 110.

In a read operation, the processor 124 may derandomize data received from the memory 110. For example, the processor 124 may derandomize data received from the memory 110 by using a derandomizing seed. The derandomized data may be outputted to the host.

The processor 124 may execute firmware to control the operation of the controller 120. Namely, in order to control the general operation of the controller 120 and perform a logic calculation, the processor 124 may execute (drive) firmware loaded in the working memory 125 upon booting. Hereafter, an operation of the storage device 100 according to embodiments of the disclosure will be described as implementing a processor 124 that executes firmware in which the corresponding operation is defined.

Firmware, as a program to be executed in the storage device 100 to drive the storage device 100, may include various functional layers. For example, the firmware may include binary data in which codes for executing the functional layers, respectively, are defined.

For example, the firmware may include at least one from among a flash translation layer (FTL), which performs a translating function between a logical address requested to the storage device 100 from the host and a physical address of the memory 110; a host interface layer (HIL), which serves to analyze a command requested to the storage device 100 as a storage device from the host and transfer the command to the flash translation layer (FTL); and a flash interface layer (FIL), which transfers a command, instructed from the flash translation layer (FTL), to the memory 110.

Such firmware may be loaded in the working memory 125 from, for example, the memory 110 or a separate nonvolatile memory (e.g., a ROM or a NOR Flash) located outside the memory 110. The processor 124 may first load all or a part of the firmware in the working memory 125 when executing a booting operation after power-on.

The processor 124 may perform a logic calculation, which is defined in the firmware loaded in the working memory 125, to control the general operation of the controller 120. The processor 124 may store a result of performing the logic calculation defined in the firmware, in the working memory 125. The processor 124 may control the controller 120 according to a result of performing the logic calculation defined in the firmware such that the controller 120 generates a command or a signal. When a part of firmware in which a logic calculation to be performed is defined is stored in the memory 110, but not loaded in the working memory 125, the processor 124 may generate an event (e.g., an interrupt) for loading the corresponding part of the firmware into the working memory 125 from the memory 110.

The processor 124 may load metadata necessary for driving firmware from the memory 110. The metadata, as data for managing the memory 110, may include for example management information on user data stored in the memory 110.

Firmware may be updated while the storage device 100 is manufactured or while the storage device 100 is operating. The controller 120 may download new firmware from the outside of the storage device 100 and update existing firmware with the new firmware.

To drive the controller 120, the working memory 125 may store necessary firmware, a program code, a command and data. The working memory 125 may be a volatile memory that includes, for example, at least one from among an SRAM (static RAM), a DRAM (dynamic RAM) and an SDRAM (synchronous DRAM).

The error detection and correction circuit 126 may detect an error bit of target data, and correct the detected error bit by using an error correction code. The target data may be, for example, data stored in the working memory 125 or data read from the memory 110.

The error detection and correction circuit 126 may decode data by using an error correction code. The error detection and correction circuit 126 may be realized by various code decoders. For example, a decoder that performs unsystematic code decoding or a decoder that performs systematic code decoding may be used.

For example, the error detection and correction circuit 126 may detect an error bit by the unit of a set sector in each of read data when each read data is constituted by a plurality of sectors. A sector may mean a data unit that is smaller than a page, which is the read unit of a flash memory. Sectors constituting each read data may be matched with one another using an address.

The error detection and correction circuit 126 may calculate a bit error rate (BER), and may determine whether an error is correctable or not, by sector units. For example, when a bit error rate (BER) is higher than a reference value, the error detection and correction circuit 126 may determine that a corresponding sector is uncorrectable or a fail. On the other hand, when a bit error rate (BER) is lower than the reference value, the error detection and correction circuit 432 may determine that a corresponding sector is correctable or a pass.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, then the error detection and correction circuit 126 may detect a sector uncorrectable read data last. There may be one or more sectors that are determined to be uncorrectable. The error detection and correction circuit 126 may transfer information (for example, address information) regarding a sector which is determined to be uncorrectable to the processor 124.

A bus 127 may be configured to provide channels among the components 121, 122, 124, 125 and 126 of the controller 120. The bus 127 may include, for example, a control bus for transferring various control signals, commands and the like, a data bus for transferring various data, and so forth.

Some components among the above-described components 121, 122, 124, 125 and 126 of the controller 120 may be omitted, or some components among the above-described components 121, 122, 124, 125 and 126 of the controller 120 may be integrated into one component. In addition to the above-described components 121, 122, 124, 125 and 126 of the controller 120, one or more other components may be added.

Hereinbelow, the memory 110 will be described in further detail with reference to FIG. 2.

Figure 2:
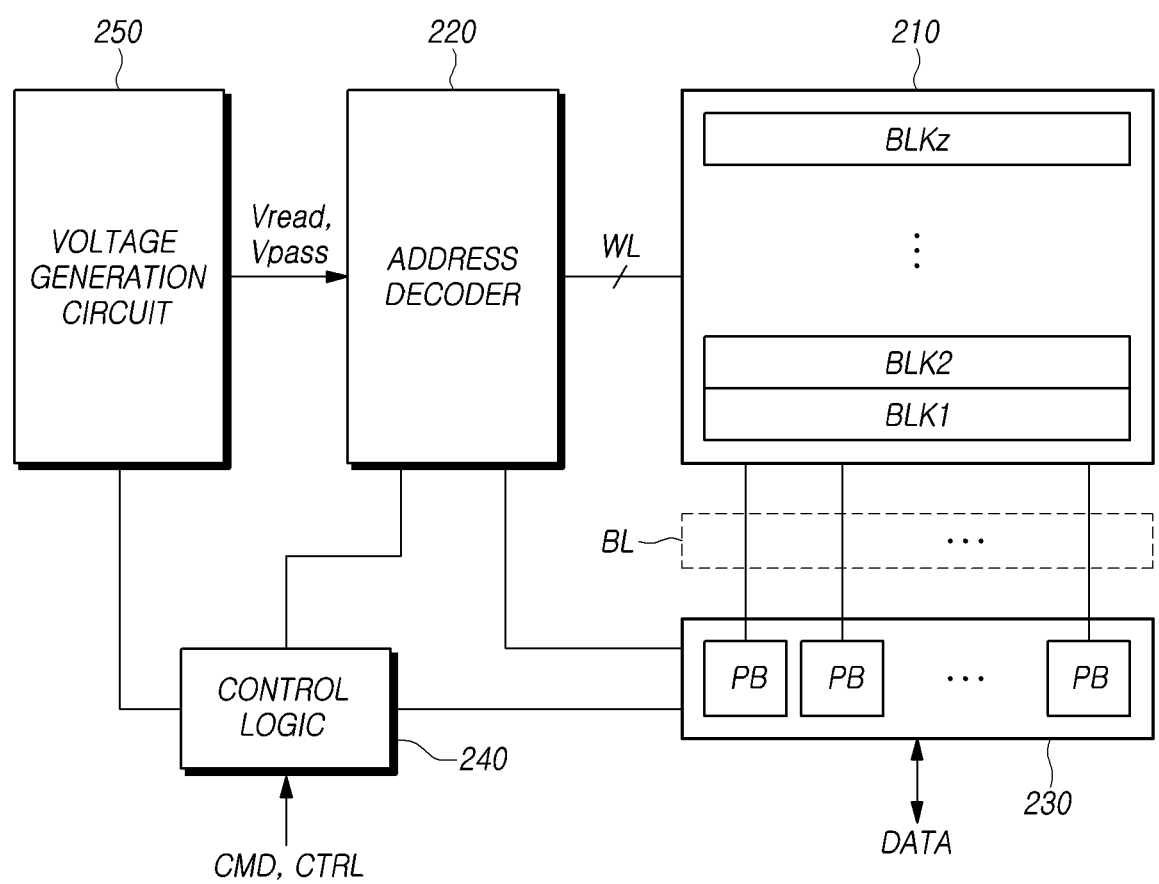
FIG. 2 is a block diagram schematically illustrating a memory of FIG. 1.

FIG. 2 is a block diagram schematically illustrating a memory 110 of FIG. 1.

Referring to FIG. 2, the memory 110 according to an embodiment of the disclosure may include a memory cell array 210, an address decoder 220, a read and write circuit 230, a control logic 240, and a voltage generation circuit 250.

The memory cell array 210 may include a plurality of memory blocks BLK1 to BLKz (where z is a natural number of 2 or greater).

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells that have vertical channel structures.

The memory cell array 210 may be configured by a memory cell array of a two-dimensional structure or may be configured by a memory cell array of a three-dimensional structure.

Each of the plurality of memory cells included in the memory cell array 210 may store at least 1-bit data. For instance, each of the plurality of memory cells included in the memory cell array 210 may be a signal level cell (SLC) that stores 1-bit data. In another instance, each of the plurality of memory cells included in the memory cell array 210 may be a multi-level cell (MLC) that stores 2-bit data. In still another instance, each of the plurality of memory cells included in the memory cell array 210 may be a triple level cell (TLC) that stores 3-bit data. In yet another instance, each of the plurality of memory cells included in the memory cell array 210 may be a quad level cell (QLC) that stores 4-bit data. In a further instance, the memory cell array 210 may include a plurality of memory cells, each of which stores 5 or more-bit data.

The number of bits of data stored in each of the plurality of memory cells may be dynamically determined. For example, a single-level cell that stores 1-bit data may be changed to a triple-level cell that stores 3-bit data.

Referring to FIG. 2, the address decoder 220, the read and writhe circuit 230, the control logic 240 and the voltage generation circuit 250 may operate as a peripheral circuit that drives the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block during a read operation, and may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory 110 may be performed by the unit of a page. An address received when a read operation or a program operation is requested may include at least one from among a block address, a row address and a column address.

The address decoder 220 may select one memory block and one word line depending on a block address and a row address. A column address may be decoded by the address decoder 220 and be provided to the read and write circuit 230.

The address decoder 220 may include at least one from among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit that includes a plurality of page buffers PB. The read and write circuit 230 may include data buffers which take charge of a data processing function, and may further include cache buffers that take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, changes in the amounts of current flowing, depending on the programmed states of the corresponding memory cells.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory 110. As an exemplary embodiment, the read and write circuit 230 may include a column select circuit in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory 110.

The control logic 240 may be configured to control general operations of the memory 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Each memory block of the memory 110 described above may be configured by a plurality of pages corresponding to a plurality of word lines WL and a plurality of strings corresponding to a plurality of bit lines BL.

In a memory block BLK, a plurality of word lines WL and a plurality of bit lines BL may be disposed to intersect with each other. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

A memory cell may be coupled to one of the plurality of word lines WL and one of the plurality of bit lines BL. A transistor may be disposed in each memory cell.

For example, a transistor disposed in each memory cell (MC) may include a drain, a source and a gate. The drain (or source) of the transistor may be coupled with a corresponding bit line BL directly or via another transistor. The source (or drain) of the transistor may be coupled with a source line (which may be the ground) directly or via another transistor. The gate of the transistor may include a floating gate, which is surrounded by a dielectric, and a control gate to which a gate voltage is applied from a word line WL.

In each memory block, a first select line (also referred to as a source select line or a drain select line) may be additionally disposed outside a first outermost word line more adjacent to the read and write circuit 230 between two outermost word lines, and a second select line (also referred to as a drain select line or a source select line) may be additionally disposed outside a second outermost word line between the two outermost word lines.

At least one dummy word line may be additionally disposed between the first outermost word line and the first select line. At least one dummy word line may also be additionally disposed between the second outermost word line and the second select line.

A read operation and a program operation (write operation) of the memory block described above may be performed by the unit of a page, and an erase operation may be performed by the unit of a memory block.

Figure 3:
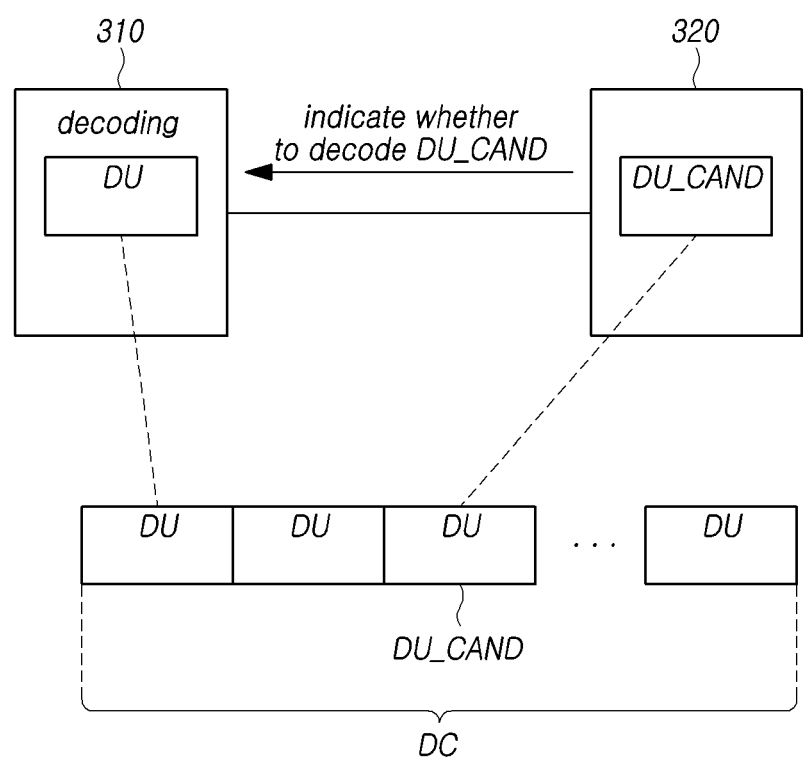
FIG. 3 is a diagram illustrating a schematic structure of a decoding device according to an embodiment of the disclosure.

FIG. 3 is a diagram illustrating a schematic structure of a decoding device 300 according to an embodiment of the disclosure.

Referring to FIG. 3, the decoding device 300 may include a decoder 310 and a pre-processing device 320.

The decoder 310 may perform decoding on at least one of a plurality of data units DU. The decoder 310 may decode one data unit per cycle, or may decode one or more data units in parallel per cycle.

Each of the plurality of data units DU may indicate information on data of a specific number of bits (e.g., 128 bits). The plurality of data units DU may be included in one data chunk DC. The data chunk DC may be referred to as a codeword, a code unit, or the like.

When the decoder 310 performs decoding on the data unit DU, the decoder 310 may search for an error bit among the bits of data of the data unit DU, and may execute a bit-flip for the error bit. This process may be repeated.

When the number of bit-flips in the data unit DU is equal to or larger than a threshold number of bit-flips, the decoder 310 may repeatedly perform decoding again on the corresponding data unit DU.

The pre-processing device 320 may determine a candidate data unit DU_CAND from among the plurality of data units DU. The pre-processing device 320 may determine whether to decode the candidate data unit DU_CAND using the decoder 310.

For example, the pre-processing device 320 may determine whether to decode or skip decoding the candidate data unit DU_CAND after the decoder 310 completes decoding on a currently decoded data unit DU.

When the pre-processing device 320 determines that the candidate data unit DU_CAND is to be decoded using the decoder 310, the decoder 310 may receive the candidate data unit DU_CAND and execute decoding on the candidate data unit DU_CAND.

On the other hand, when the pre-processing device 320 determines that the operation of decoding the candidate data unit DU_CAND by the decoder 310 should be skipped, the decoder 310 does not execute the operation of decoding the candidate data unit DU_CAND.

In embodiments of the disclosed technology, the decoding device 300 determines whether to decode the candidate data unit DU_CAND, using the pre-processing device 320, for the following reasons.

Among the plurality of data units DU to be processed by the decoding device 300, there may be a data unit in which no possibility of an error may occur. If the decoder 310 performs decoding on a data unit for which no error can occur, then the decoder 310 consumes time and power when executing unnecessary decoding.

Therefore, the pre-processing device 320 may determine in advance whether it is necessary to decode a candidate data unit DU_CAND using the decoder 310. The amounts of time and power required for the pre-processing device 320 to determine whether to decode the candidate data unit DU_CAND are smaller than amounts of time and power required for the decoder 310 to execute decoding on the candidate data unit DU_CAND.

When it is necessary to decode the candidate data unit DU_CAND, the pre-processing device 320 may control the decoder 310 to decode the candidate data unit DU_CAND, and when it is not necessary to decode the candidate data unit DU_CAND, the pre-processing device 320 may control the decoder 310 to skip the operation of decoding the candidate data unit DU_CAND.

Since the decoder 310 does not perform decoding on the candidate data unit DU_CAND when decoding is not required, time and power consumed for the decoder 310 to execute decoding may be reduced.

The decoder 310 and the pre-processing device 320 may operate in parallel. In other words, while the decoder 310 executes decoding on one of the plurality of data units DU, the pre-processing device 320 may determine whether it is necessary to perform decoding on one of the remaining data units DU, which excludes the data unit DU being decoded by the decoder 310 at the same time.

The decoding device 300 may be implemented in various ways. For example, the decoding device 300 may be a controller 120 of a storage device 100 described above with reference to FIG. 1. The decoder 310 and the pre-processing device 320 may be a processor 124 or an error detection and correction circuit 126 of FIG. 1. The data chunk DC and the plurality of data units DU included in the data chunk DC may be stored in a memory 110 of the storage device 100.

In another example, the decoding device 300 may be a separate computation device that is distinguished from the storage device 100 described above with reference to FIG. 1.

Hereinafter, the structure of the data unit DU on which the decoder 310 executes decoding will be described with reference to FIG. 4.

Figure 4:
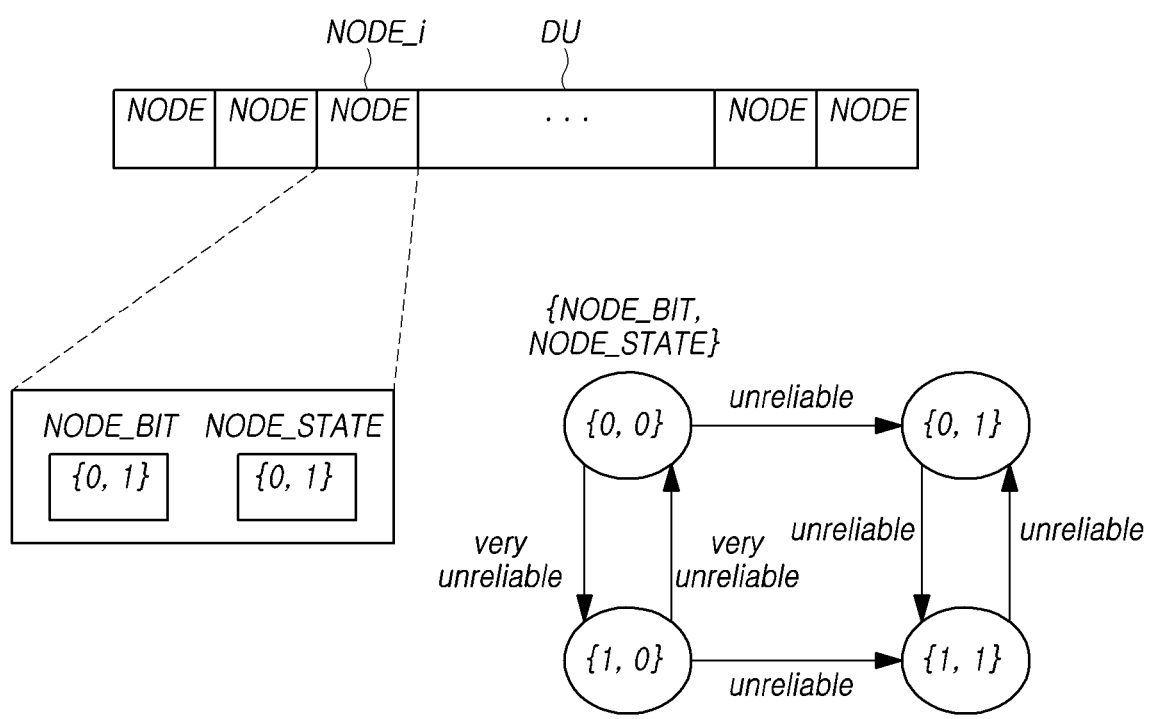
FIG. 4 is a diagram illustrating an example of the structure of a data unit according to an embodiment of the disclosure.

FIG. 4 is a diagram illustrating an example of the structure of a data unit DU according to an embodiment of the disclosure.

Referring to FIG. 4, the data unit DU may include a plurality of nodes NODE. Each of the plurality of nodes NODE may include a data bit NODE_BIT and state information NODE_STATE.

The data bit NODE_BIT of the node NODE may be a bit value of data indicated by the corresponding node NODE. The state information NODE_STATE of the node NODE may be a value indicating a state of a bit of data (e.g., the reliability of a data bit) indicated by the corresponding node NODE.

For example, when the data unit DU indicates data of K (e.g., 128) bits, the data unit DU may include K number of nodes NODE. An i-th node NODE_i among the K number of nodes NODE may include an i-th data bit among the data of K bits and state information of the i-th node NODE_i.

In FIG. 4, the value of the data bit NODE_BIT included in the i-th node NODE_i may be 0 or 1. Also, the value of the state information NODE_STATE included in the i-th node NODE_i may be 0 or 1.

The value of the state information NODE_STATE included in the i-th node NODE_i may indicate the reliability of the value of the data bit NODE_BIT included in the i-th node NODE_i. For example, when the reliability of the data bit NODE_BIT included in the i-th node NODE_i is strong, the value of the state information NODE_STATE included in the i-th node NODE_i may be 0, and when the reliability of the data bit NODE_BIT included in the i-th node NODE_i is weak, the value of the state information NODE_STATE included in the i-th node NODE_i may be 1.

The decoder 310 of the storage device 300 may change the values of the data bit NODE_BIT and the state information NODE_STATE of the node NODE included in the data unit DU in the process of decoding the data unit DU.

Referring to FIG. 4, upon determining that the data bit NODE_BIT of the node NODE is very unreliable while in a state in which the state information NODE_STATE of the corresponding node NODE is 0, the decoder 310 may flip the data bit NODE_BIT of the corresponding node NODE. Upon determining that the data bit NODE_BIT of the node NODE is unreliable while in a state in which the state information NODE_STATE of the corresponding node NODE is 0, the decoder 310 may change the state information NODE_STATE of the corresponding node NODE from 0 to 1.

In another example, upon determining that the data bit NODE_BIT of the node NODE is unreliable while in a state in which the state information NODE_STATE of the corresponding node NODE is 1, the decoder 310 may flip the data bit NODE_BIT of the corresponding node NODE.

The decoder 310 may determine whether the data bit NODE_BIT of the corresponding node NODE is very unreliable or whether the data bit NODE_BIT of the corresponding node NODE is unreliable, through a result of a calculation associated with the corresponding node NODE.

Figure 5:
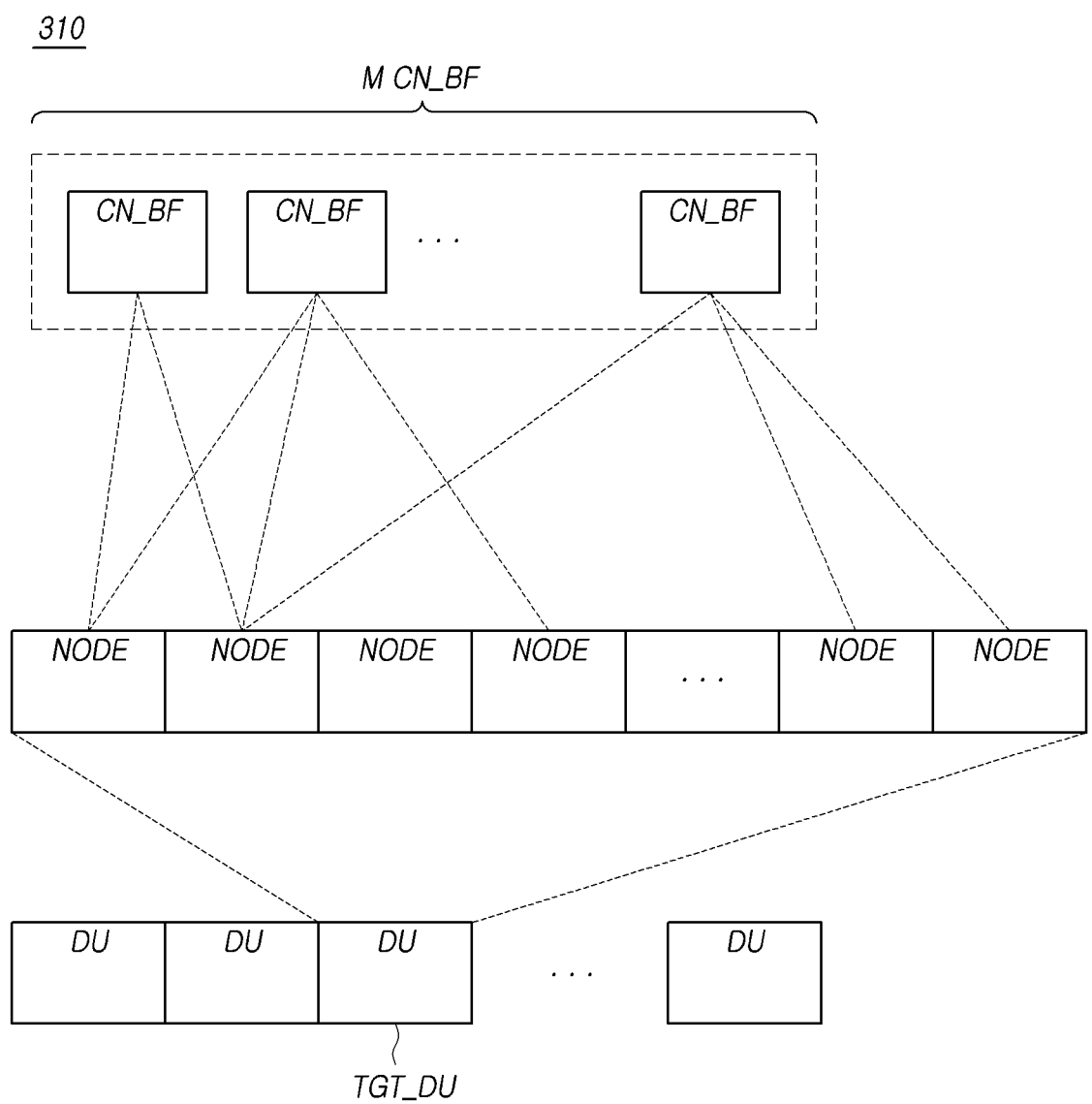
FIG. 5 is a diagram illustrating a schematic operation of a decoder according to an embodiment of the disclosure.

FIG. 5 is a diagram illustrating a schematic operation of a decoder 310 according to an embodiment of the disclosure.

Referring to FIG. 5, the decoder 310 may receive a target data unit TGT_DU, from among the plurality of data units DU described above, and execute decoding on the target data unit TGT_DU.

For example, the decoder 310 may generate result value by executing M (where M is a natural number) number of bit-flip check expressions CN_BF on the basis of nodes included in the target data unit TGT_DU. The decoder 310 may determine whether to change a data bit or state information for each of the nodes NODE included in the target data unit TGT_DU using results of executing the M number of bit-flip check expressions CN_BF.

For example, the decoder 310 may calculate flip scores for the nodes NODE included in the target data unit TGT_DU, on the basis of results of executing the M number of bit-flip check expressions CN_BF. A flip score for a specific node NODE included in the target data unit TGT_DU may be information indicating whether to perform a bit-flip on the corresponding node NODE.

A flip score for a specific node NODE included in the target data unit TGT_DU may be determined on the basis of the sum of results of executing bit-flip check expressions CN_BF, which use the corresponding node NODE, among the M number of bit-flip check expressions CN_BF. A result of an XOR calculation on change information accumulated for the data bit of the corresponding node NODE may be added to the flip score for the corresponding node NODE.

The decoder 310 may change data bits or state information included in the nodes NODE included in the target data unit TGT_DU on the basis of flip scores for the nodes NODE included in the target data unit TGT_DU.

Each of the M number of bit-flip check expressions CN_BF may be an expression that executes a target calculation on at least one among the data bits included in the nodes NODE included in the target data unit TGT_DU. Meanwhile bit-flip check expression may be called as a bit-flip check node. In this case, the target calculation may be an XOR calculation.

A matrix may be used to define which nodes NODE, from among the nodes NODE included in the target data unit TGT_DU, correspond to each of the M number of bit-flip check expressions CN_BF.

The matrix may have M number of rows, and may have as many columns as the number of the nodes NODE included in the target data unit TGT_DU. In this case, the matrix may be a sub-matrix of H-matrix.

The value of an (i, j) element of the matrix may indicate whether an i-th bit-flip check expression CN_BF among the M number of bit-flip check expressions CN_BF executes a target calculation on the data bit included in a j-th node NODE, from among the nodes NODE included in the target data unit TGT_DU.

Figure 6:
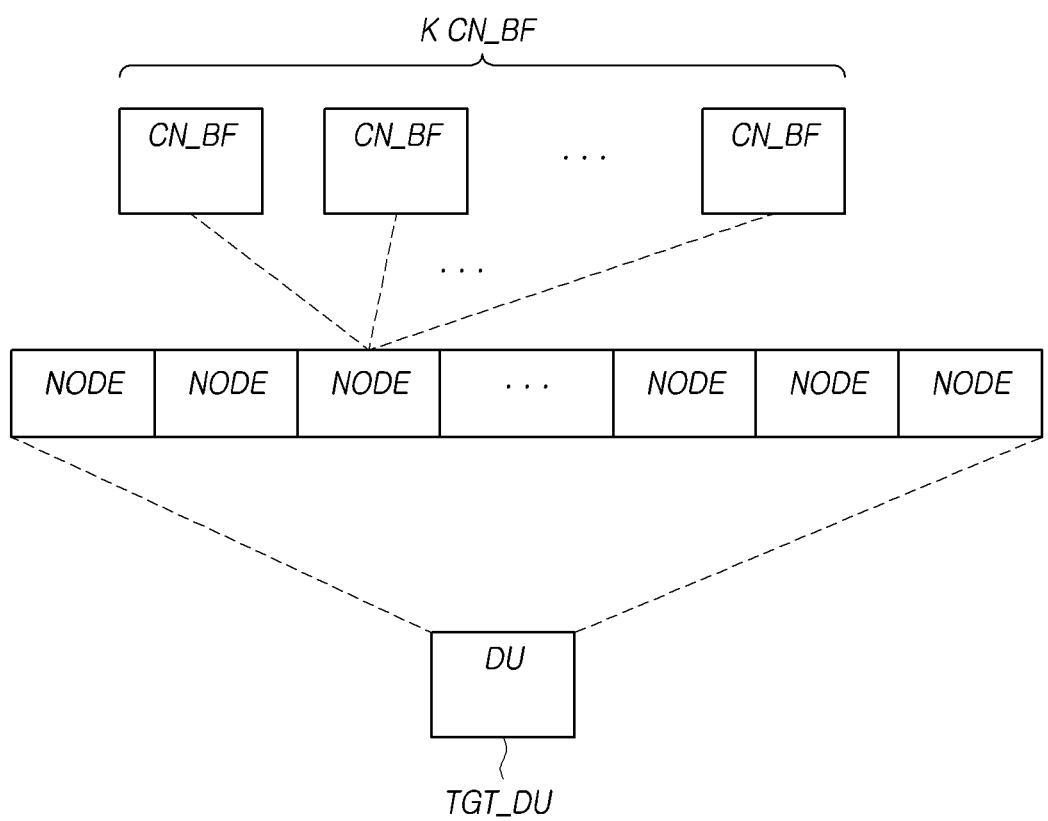
FIG. 6 is a diagram illustrating an operation for a decoder to determine whether to change data bit or state information of node included in a target data unit according to an embodiment of the disclosure.

FIG. 6 is a diagram illustrating an operation for a decoder 310 to determine whether to change data bit NODE_BIT or state information of node NODE included in a target data unit TGT_DU according to an embodiment of the disclosure.

Referring to FIG. 6, The decoder 310 may determine whether to change data bit NODE_BIT or state information for each of the plurality of nodes NODE included in the target data unit TGT_DU based on K (K is a natural number less than or equal to M) among the results of executing the M bit-flip check expressions CN_BF described in FIG. 5.

At this time, K bit-flip check expressions CN_BF used to determine whether to change data bit NODE_BIT or state information for each of the plurality of nodes NODE may be different for each of the plurality of nodes NODE.

The schematic operation of the decoder 310 based on the embodiment of the disclosed technology has been described above. Hereinbelow, a schematic operation of the pre-processing device 320 will be described.

Figure 7:
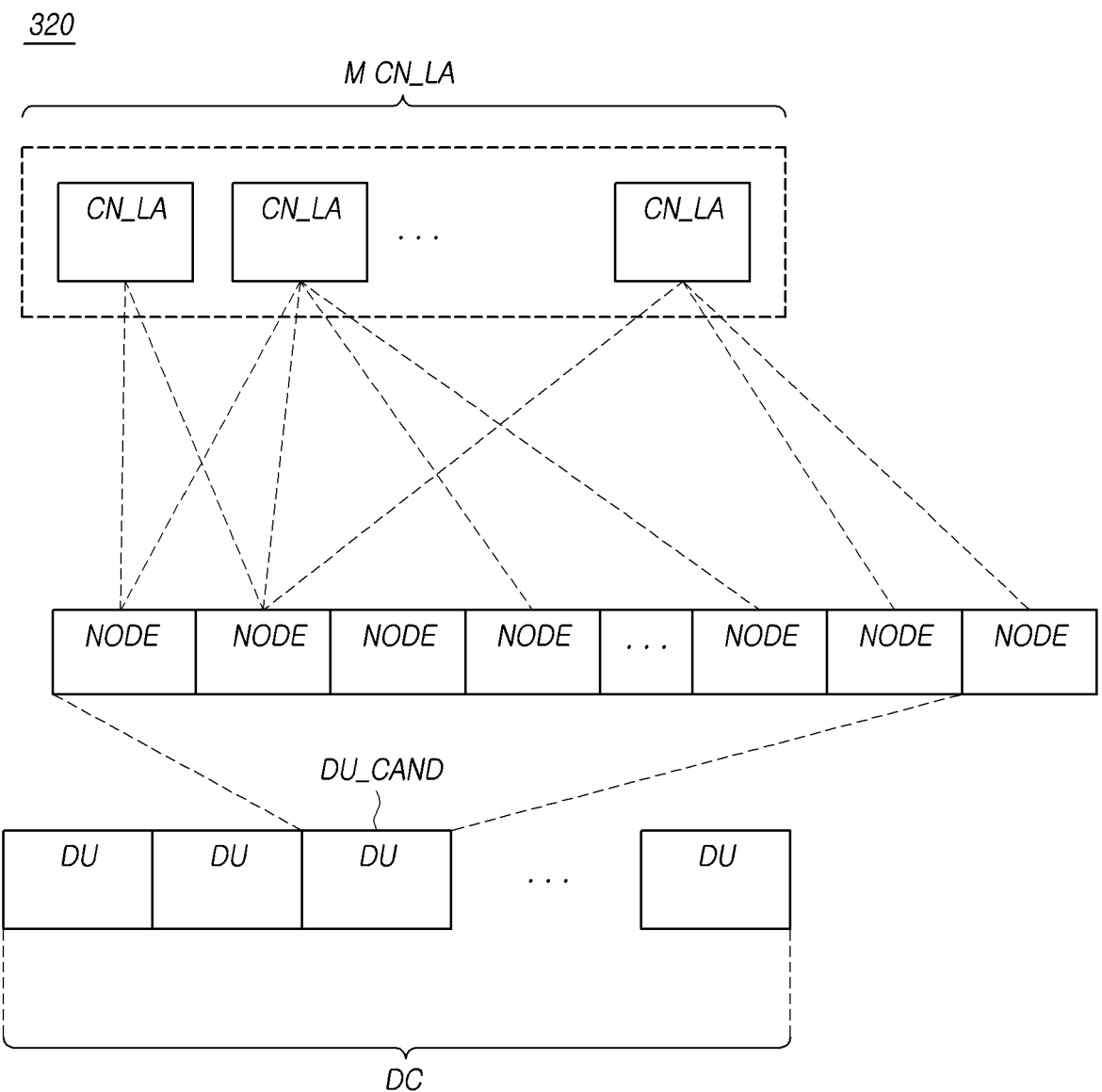
FIG. 7 is a diagram illustrating a schematic operation of a pre-processing device according to an embodiment of the disclosure.

FIG. 7 is a diagram illustrating a schematic operation of a pre-processing device 320 according to an embodiment of the disclosure.

Referring to FIG. 7, the pre-processing device 320 may execute M number of pre-processing check expressions CN_LA on the aforementioned candidate data unit DU_CAND. That is, the number of pre-processing check expressions CN_LA executed by the pre-processing device 320 may be the same as the number of bit-flip check expressions CN_BF executed by the decoder 310. Meanwhile the pre-processing check expression and the bit-flip check expression may be the same or different from each other, Meanwhile, the pre-processing check expression may be called as a pre-processing check node.

The pre-processing device 320 may calculate flip scores for nodes NODE included in the candidate data unit DU_CAND, on the basis of results of executing the M number of pre-processing check expressions CN_LA.

A flip score for a specific node NODE included in the candidate data unit DU_CAND may be determined on the basis of the sum of results of executing pre-processing check expressions CN_LA using the corresponding node NODE from among the M number of pre-processing check expressions CN_LA.

A method in which a decoder 310 calculates a flip score for a specific node NODE in FIG. 5 and a method in which a pre-processing device 320 calculates a flip score for a specific node NODE in FIG. 7 may be different from each other. For example, the number of pre-processing check expressions CN_LA used by the pre-processing device 320 to calculate a flip score for a specific node NODE may be smaller than the number of bit-flip check expressions CN_BF used by the decoder 310 to calculate a flip score for a specific node NODE.

The pre-processing device 320 may determine whether to decode the candidate data unit DU_CAND using the decoder 310, on the basis of flip scores for the nodes NODE included in the candidate data unit DU_CAND.

Each of the M number of pre-processing check expressions CN_LA may be an expression that executes a target calculation on at least one from among the data bits included in the nodes NODE, which are included in the candidate data unit DU_CAND.

Figure 8:
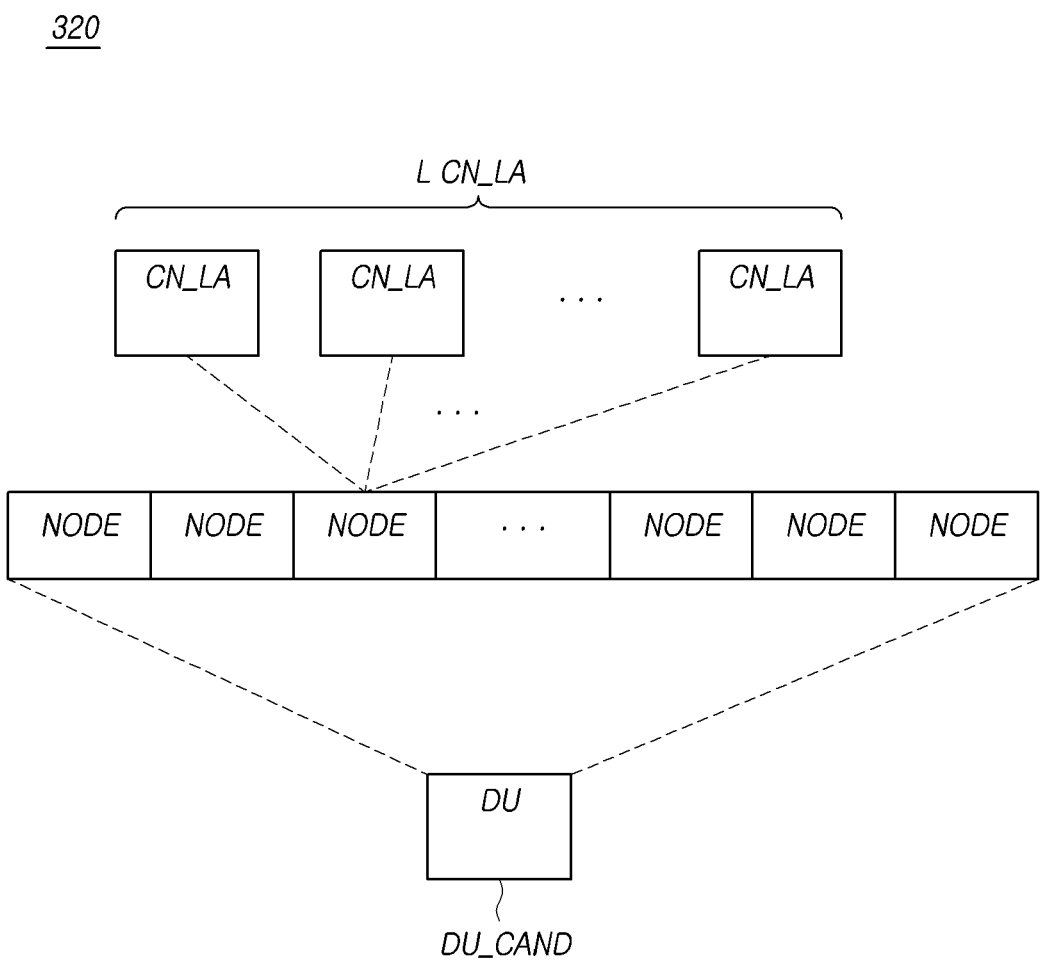
FIG. 8 is a diagram illustrating an operation of the pre-processing device calculating a flip score of node included in a candidate data unit according to an embodiment of the disclosure.

FIG. 8 is a diagram illustrating an operation of the pre-processing device 320 calculating a flip score of node NODE included in a candidate data unit DU_CAND according to an embodiment of the disclosure.

The pre-processing device 320 may determine whether to change data bit or status information for each of the nodes included in the candidate data unit DU_CAND based on L (L is a natural number less than or equal to M) of the results of executing M pre-processing check expressions CN_LA calculated in FIG. 7.

In this case, L pre-processing check expressions CN_LA used to determine whether to change data bit or state information for each node may be different from each other.

Hereunder, the difference between the operation of the decoder 310 using the bit-flip check expression CN_BF described above with reference to FIG. 5 and the operation of the pre-processing device 320 using the pre-processing check expression CN_LA described above with reference to FIG. 7 will be described.

Figure 9:
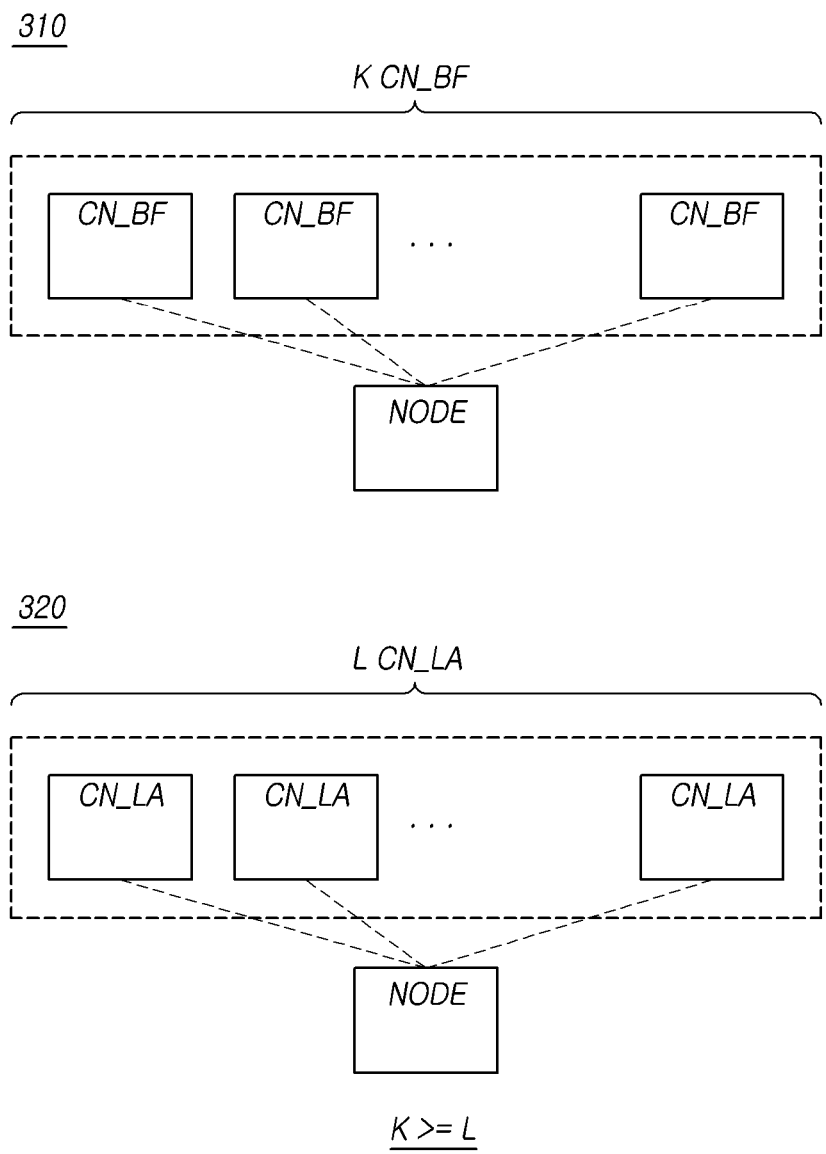
FIG. 9 is a diagram illustrating an example of comparing operation of a decoder and operation of a pre-processing device according to an embodiment of the disclosure.

FIG. 9 is a diagram illustrating an example of comparing operation of a decoder 310 and operation of a pre-processing device 320 according to an embodiment of the disclosure.

Referring to FIG. 9, the number K described in FIG. 6 is greater than or equal to the number L described in FIG. 8.

This means that the number of check expressions used by the pre-processing device 320 to determine the flip-score for each of the nodes included in the candidate data unit DU_CAND may be smaller than the number of check expressions used ty the decoder 310 to determine whether to change data bit or state information for each of the nodes included in the target data unit TGT_DU. Accordingly, the pre-processing device 320 may determine whether to decode the data unit DU more quickly than the decoder 310.

Figure 10:
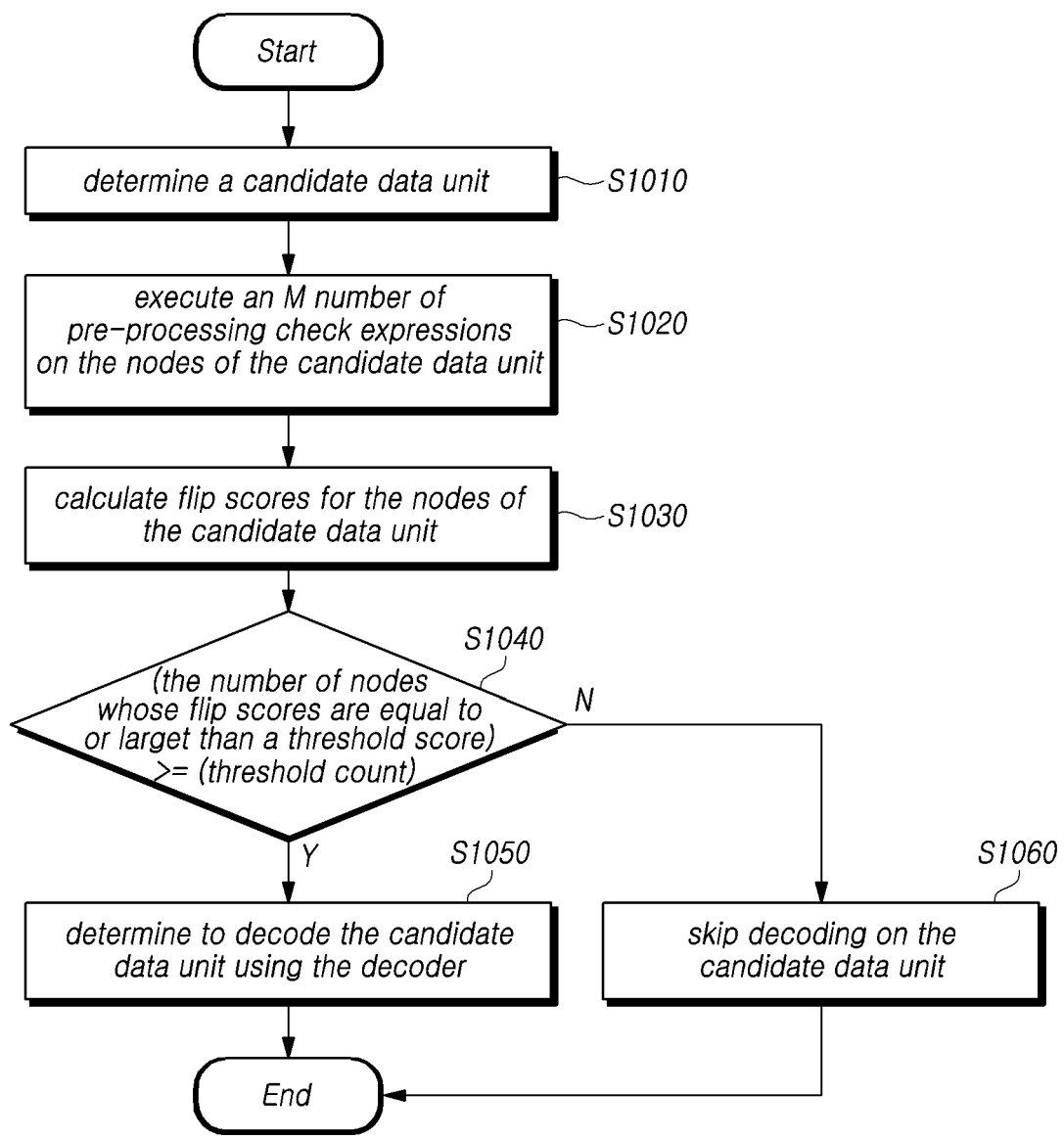
FIG. 10 is a flowchart illustrating an example of an operation for a decoding device to determine whether to decode a candidate data unit according to an embodiment of the disclosure.

FIG. 10 is a flowchart illustrating an example of an operation for a decoding device 300 to determine whether to decode a candidate data unit DU_CAND according to an embodiment of the disclosure.

Referring to FIG. 10, a pre-processing device 320 of a decoding device 300 may first determine a candidate data unit DU_CAND (S1010).

As described above with reference to FIG. 7, the pre-processing device 320 may execute an M number of pre-processing check expressions CN_LA on the nodes NODE of the candidate data unit DU_CAND (S1020).

The pre-processing device 320 may calculate flip scores for the nodes NODE of the candidate data unit DU_CAND (S1030).

The pre-processing device 320 may determine whether the number of nodes NODE whose flip scores are equal to or larger than a threshold score, from among the nodes NODE included in the candidate data unit DU_CAND, is equal to or larger than a threshold count (S1040).

When the number of nodes NODE in the candidate data unit DU_CAND whose flip scores are equal to or larger than the threshold score is equal to or larger than the threshold count (S1040-Y), the pre-processing device 320 may determine to decode the candidate data unit DU_CAND using the decoder 310 (S1050). This is because it is necessary to correct the error existing in the candidate data unit DU_CAND by using the decoder 310 after diagnosing a high possibility that an error exists in the candidate data unit DU_CAND when the score exceeds a predetermined threshold.

On the other hand, when the number of nodes NODE in the candidate data unit DU_CAND whose flip scores are equal to or larger than the threshold score is smaller than the threshold count (S1040-N), the pre-processing device 320 may skip decoding on the candidate data unit DU_CAND (S1060). This reduces the time and power needed for decoding the candidate data unit DU_CAND, since there is a low possibility that an error exists in the candidate data unit DU_CAND.

Figure 11:
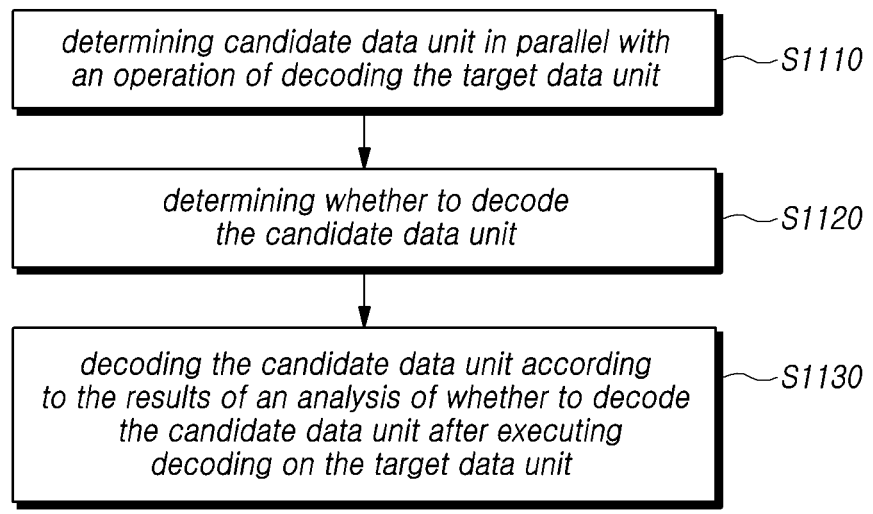
FIG. 11 is a diagram illustrating a method for operating a decoding device according to an embodiment of the disclosure.

FIG. 11 is a diagram illustrating a method for operating a decoding device 300 according to an embodiment of the disclosure.

Referring to FIG. 11, the method for operating the decoding device 300 may include determining the candidate data unit DU_CAND in parallel with an operation of decoding the target data unit TGT_DU from among a plurality of data units DU included in the one data chunk DC (S1110).

Each of the plurality of data units DU may include a plurality of nodes NODE. Each of the plurality of nodes NODE may include a data bit NODE_BIT and a state information NODE_STATE.

The method for operating the decoding device 300 may include determining whether to decode the candidate data unit DU_CAND (S1120).

The method for operating the decoding device 300 may include decoding the candidate data unit DU_CAND according to the result of an analysis of whether to decode the candidate data unit DU_CAND, after executing decoding on the target data unit TGT_DU (S1130).

For example, the method for operating the decoding device 300 may include (i) executing an M (where M is a natural number) number of bit-flip check expressions CN_BF on the basis of the nodes NODE included in the target data unit TGT_DU; and (ii) determining whether to change the data bit NODE_BIT or the state information NODE_STATE for each of the nodes NODE included in the target data unit TGT_DU, on the basis of K (K is a natural number less than or equal to M) among the results of executing the M number of bit-flip check expressions CN_BF.

Each of the M number of bit-flip check expressions CN_BF may be an expression that executes a target calculation on at least one from among the data bits included in the nodes NODE included in the target data unit TGT_DU. For example, the target calculation may be an XOR calculation.

The step S1120 of determining whether to decode the candidate data unit DU_CAND may include: (i) executing an M number of pre-processing check expressions CN_LA on the basis of the nodes NODE included in the candidate data unit DU_CAND; (ii) calculating flip scores for the nodes NODE included in the candidate data unit DU_CAND, on the basis of L (L is a natural number less than or equal to M) among the results of executing the M number of pre-processing check expressions CN_LA; and (iii) determining whether to decode the candidate data unit DU_CAND, on the basis of the flip scores for the nodes NODE included in the candidate data unit DU_CAND.

Each of the M number of pre-processing check expressions CN_LA may be an expression that executes a target calculation on at least one from among the data bits included in the nodes NODE included in the candidate data unit DU_CAND.

For example, K may be larger than L.

Meanwhile, the step of determining whether to decode the candidate data unit DU_CAND on the basis of the flip scores for the nodes NODE included in the candidate data unit DU_CAND may result in the determination to decode the candidate data unit DU_CAND, such as for example, when the number of nodes NODE whose flip scores are equal to or larger than the threshold score among the nodes NODE included in the candidate data unit DU_CAND is equal to or larger than the threshold count.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A decoding device comprising:
   a decoder configured to execute decoding on at least one of a plurality of data units included in a data chunk; and
   a processor configured to determine a candidate data unit from among the plurality of data units while the decoder executes decoding, and to determine whether to decode the candidate data unit using the decoder.

2. The decoding device according to claim 1, wherein
   each of the plurality of data units includes a plurality of nodes, and
   each of the plurality of nodes includes a data bit and state information.

3. The decoding device according to claim 2, wherein
   the decoder receives a target data unit from among the plurality of data units, and determines whether to change at least one of a data bit and state information for each of nodes included in the target data unit, on the basis of K among results of executing M (M is a natural number) number of bit-flip check expressions on the nodes included in the target data unit,
   each of the M number of bit-flip check expressions is an expression that executes a target calculation on at least one of the data bits included in the nodes included in the target data unit, and
   wherein the K is a natural number less than or equal to M,
   wherein the decoder calculates flip scores for the nodes included in the target data unit based on the M number of bit-flip check expressions,
   wherein the decoder determines whether to change at least one of the data bit and state information for each of nodes included in the target data unit based on the flip scores,
   wherein flip score for each of the nodes is determined based on bit-flip check expressions, among the M number of bit-flip check expressions, corresponding the each of the nodes, and
   wherein the decoder changes state information for each of the nodes on determination that data bits of the node is unreliable through the target calculation on the node.

4. The decoding device according to claim 3, wherein the target calculation is an XOR calculation.

5. The decoding device according to claim 3, wherein
   the processor calculates flip scores for each of nodes included in the candidate data unit, on the basis of L among results of executing M number of pre-processing check expressions on the nodes included in the candidate data unit, and determines whether to decode the candidate data unit using the decoder, on the basis of each of the flip scores for the nodes included in the candidate data unit,
   each of the N number of pre-processing check expressions is an expression that executes the target calculation on at least one of the data bits included in the nodes included in the candidate data unit,
   the M is a natural number, and
   the L is a natural number less than or equal to M.

6. The decoding device according to claim 5, wherein K is larger than or equal to L.

7. The decoding device according to claim 5, wherein the processor evaluates whether to decode the candidate data unit using the decoder when the number of nodes whose flip scores are equal to or larger than a threshold score among the nodes included in the candidate data unit is equal to or larger than a threshold count.

8. A method for operating a decoding device, comprising:
determining, by a processor, a candidate data unit from among a plurality of data units included in one data chunk, in parallel with an operation of decoding a target data unit, which is different from the candidate data unit, from among the plurality of data units;
determining to decode the candidate data unit; and
decoding the candidate data unit after executing decoding on the target data unit.

9. The method according to claim 8, wherein
each of the plurality of data units includes a plurality of nodes, and
each of the plurality of nodes includes a data bit and state information.

10. The method according to claim 9, further comprising:
executing an M (M is a natural number) number of bit-flip check expressions on the basis of nodes included in the target data unit; and
determining whether to change at least one of a data bit and state information for each of the nodes included in the target data unit, on the basis of K among results of executing the M number of bit-flip check expressions,
wherein each of the M number of bit-flip check expressions is an expression that executes a target calculation on at least one of the data bits included in the nodes included in the target data unit, and
wherein the K is a natural number less than or equal to M,
wherein the determining calculates flip scores for the nodes included in the target data unit based on the M number of bit-flip check expressions,
wherein the determining determines whether to change at least one of the data bit and state information for each of nodes included in the target data unit based on the flip scores,
wherein flip score for each of the nodes is determined based on bit-flip check expressions, among the M number of bit-flip check expressions, corresponding the each of the nodes, and
wherein the determining changes state information for each of the nodes on determination that data bits of the node is unreliable through the target calculation on the node.

11. The method according to claim 10, wherein the target calculation is an XOR calculation.

12. The method according to claim 10, wherein
the determining whether to decode the candidate data unit comprises:
executing an M number of pre-processing check expressions on the basis of the nodes included in the candidate data unit;
calculating flip scores for the nodes included in the candidate data unit, on the basis of L among results of executing the M number of pre-processing check expressions; and
determining whether to decode the candidate data unit, on the basis of the flip scores for the nodes included in the candidate data unit,
wherein each of the M number of pre-processing check expressions is an expression that executes the target calculation on at least one of the data bits included in the nodes included in the candidate data unit,
wherein the M is a natural number, and
wherein the L is a natural number less than or equal to the M.

13. The method according to claim 12, wherein K is larger than L.

14. The method according to claim 12, wherein the determining whether to decode the candidate data unit includes determining to decode the candidate data unit when the number of nodes included in the candidate data unit whose flip scores are equal to or larger than a threshold score is equal to or larger than a threshold count.

15. A storage device comprising:
a memory configured to store a plurality of data units included in one data chunk; and
a controller containing a processor configured to execute decoding on at least one of the plurality of data units, to identify a candidate data unit among the plurality of data units while executing decoding on the at least one of the plurality of data units, and to determine whether to decode the candidate data unit using a decoder.

* * * * *